(12) United States Patent
Teo et al.

(10) Patent No.: US 7,888,214 B2
(45) Date of Patent: Feb. 15, 2011

(54) SELECTIVE STRESS RELAXATION OF CONTACT ETCH STOP LAYER THROUGH LAYOUT DESIGN

(75) Inventors: Lee Wee Teo, Singapore (SG); Elgin Quek, Singapore (SG); Dong Kyun Sohn, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 749 days.

(21) Appl. No.: 11/302,035

(22) Filed: Dec. 13, 2005

(65) Prior Publication Data

US 2007/0132032 A1 Jun. 14, 2007

(51) Int. Cl.
*H01L 21/336* (2006.01)

(52) U.S. Cl. .......... 438/286; 438/154; 438/199; 438/203; 438/233; 257/369; 257/E21.633; 257/E21.634

(58) Field of Classification Search ............ 438/153, 438/154, 157, 170, 197, 199, 203, 204, 236, 438/626, 233, 286; 257/369, E21.438, E21.633, 257/E21.634, E21.641
See application file for complete search history.

(56) References Cited

U.S. PATENT DOCUMENTS 6,573,172 B1  6/2003  En

| | | |
|---|---|---|
| 2002/0045325 A1 | 4/2002 | Kuhn |
| 2004/0142545 A1 | 7/2004 | Ngo |
| 2004/0235236 A1 | 11/2004 | Hoffmann |
| 2004/0253791 A1 | 12/2004 | Sun |
| 2005/0032275 A1 | 2/2005 | Toda |
| 2006/0131662 A1* | 6/2006 | Yamada et al. ............. 257/374 |

OTHER PUBLICATIONS

S.M. Cea et. al, "Front End Stress Modeling for Advanced Logic Technologies", IEDM 2004.

* cited by examiner

*Primary Examiner*—Matthew C Landau
*Assistant Examiner*—Colleen E Snow
(74) *Attorney, Agent, or Firm*—Horizon IP Pte Ltd (57) ABSTRACT

A structure and method of fabrication of a semiconductor device, where a stress layer is formed over a MOS transistor to put either tensile stress or compressive stress on the channel region. The parameters such as the location and area of the contact hole thru the stress layer are chosen to produce a desired amount of stress to improve device performance. In an example embodiment for a tensile stress layer, the PMOS S/D contact area is larger than the NMOS S/D contact area so the tensile stress on the PMOS channel is less than the tensile stress on the NMOS channel. In an example embodiment for a compressive stress layer, the NMOS contact area is larger than the PMOS contact area so that the compressive stress on the NMOS channel is less than the compressive stress on the PMOS channel.

29 Claims, 7 Drawing Sheets

SMALL CONTACT AND FAR AWAY FROM GATE

SELECTIVE STRESS RELAXATION OF CONTACT ETCH STOP LAYER THROUGH LAYOUT DESIGN

BACKGROUND OF INVENTION

1) Field of the Invention

This invention relates generally to structures and methods for making semiconductor devices and more particularly to the structures and methods for semiconductor devices having stress layers.

2) Description of the Prior Art

Conventional transistor scaling is facing immense difficulties. One way to enhance transistor performance is through the Improvements in performances of MOS transistors and CMOS have been made by shrinkage or scaling down thereof, for example, shortening a channel length and a reduction in thickness of a gate insulating film. A reduction in thickness of the gate insulating film and a minimum size or dimension for process have become closer to the limitations. A further improvement in performance can not depend upon the limited shrinkage or scaling down of the device, but should depend upon any other measures than the shrinkage or scaling down of the device.

One of the improvements in performance of the device is a technique of applying a stress to a channel region for improving a carrier mobility, so called strained-Si channel technique. The use of strain-Si to improve carrier mobility which gives raise to higher drive current. There are various ways to induce strain in the conduction channel. These include pseudomorphically growing strain Si on virtual SiGe substrate, using SiGe source/drain stressors or process-induced strained Si.

There is a need for improved strain-Si structures and process to improve device performance.

The importance of overcoming the various deficiencies noted above is evidenced by the extensive technological development directed to the subject, as documented by the relevant patent and technical literature. The closest and apparently more relevant technical developments in the patent literature can be gleaned by considering the following.

US20050032275A1: Toda—Mos semiconductor device—Semiconductor device including p-channel MOS transistor, has larger compressive strain in channel direction than in width direction of gate, and silicon nitride insulating film.

US20040235236A1:—Hoffmann, et al.—Integrated circuit with improved channel stress properties and a method for making it—Integrated circuit comprises silicate glass layer formed only on p-type metal oxide semiconductor transistor or n-type metal oxide semiconductor transistor and etch stop layer formed on silicate glass layer US20040142545A1: Inventor: Ngo—Semiconductor with tensile strained substrate and method of making the same—Formation of metal oxide semiconductor field effect transistor involves high compression deposition that increases tensile strain in silicon layer—An exemplary embodiment relates to a method for forming a metal oxide semiconductor field effect transistor (MOSFET). The method includes providing a substrate having a gate formed above the substrate and performing at least one of the following depositing steps: depositing a spacer layer and forming a spacer around a gate and gate insulator located above a layer of silicon above the substrate; depositing an etch stop layer above the spacer, the gate, and the layer of silicon; and depositing a dielectric layer above the etch stop layer. At least one of the depositing a spacer layer, depositing an etch stop layer, and depositing a dielectric layer comprises high compression deposition which increases in tensile strain in the layer of silicon.

US20020045325A1: Kuhn et al.—Thin tensile layers in shallow trench isolation and method of making same—: Formation of isolation trench involves forming film on recess sidewall under conditions that will cause the film to have tensile load, and filling the recess with material that imparts compressive load U.S. Pat. No. 6,573,172: En et al.—Methods for improving carrier mobility of PMOS and NMOS devices Fabrication of semiconductor device by forming P-channel and N-channel metal oxide semiconductor transistors in wafer, forming tensile film on P-channel transistor and forming compressive film on N-channel transistor.

US20040253791A1: Sun et al.—Methods of fabricating a semiconductor device having MOS transistor with strained channel—Fabrication of semiconductor device, by forming stress layer on substrate having transistor, and annealing stress layer to convert physical stress of stress layer into tensile stress or increase tensile stress of stress layer.

SUMMARY OF THE INVENTION

The example embodiments of the present invention provide structures and a methods of manufacturing nFET and PFET with at least an overlying stress layer where the contact holes are adapted to give the MOS transistor channels a predetermined stress.

An example method embodiment comprises the following:
a) providing a substrate having a PMOS region and a NMOS region;
b) providing a PMOS transistor in the PMOS region and a NMOS transistor in the NMOS region;
   (1) the PMOS transistor comprised of a PMOS gate, PMOS gate dielectric, PMOS channel; and PMOS S/D regions;
   (2) the NMOS transistor comprised of a NMOS gate, NMOS gate dielectric, NMOS channel, and NMOS S/D regions;
c) forming a stress layer over the substrate in at least the PMOS region and the NMOS region;
d) forming a dielectric layer over the stress layer;
e) forming PMOS S/D contact holes thru the stress layer in the PMOS region to expose portions of the PMOS S/D regions; and forming NMOS S/D contact holes through the stress layer in the NMOS region to expose portions of the NMOS S/D regions;
   (1) the PMOS S/D contact holes have a PMOS S/D contact hole area;
   (2) the NMOS S/D contact holes have a NMOS S/D contact hole area;
   (3) the stress layer and the PMOS S/D contact holes are adapted to give the PMOS channel a predetermined stress to achieve the predetermined PMOS carrier mobility;
   (4) the stress layer and the NMOS S/D contact holes are adapted to give the NMOS channel the predetermined stress to achieve a predetermined NMOS carrier mobility;
f) forming contact plugs in the PMOS contact holes and the NMOS contact holes.

In another example embodiment, two stress layers are used. The embodiment comprises: the stress layer is comprised of a NMOS stress layer that is formed over the NMOS region and a PMOS stress layer formed over the PMOS region;
the NMOS stress layer is a tensile stress layer that puts a tensile stress on the NMOS channel;

the PMOS stress layer is a compressive stress layer that puts a compressive stress on the PMOS channel;

whereby the stress on the channel regions is optimized or maximized.

Additional example embodiments and options are presented in the following specification and claims.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 2A and 2B show top down views of an example embodiment for adapting the S/D contact hole area to obtain the desired stress on the channel regions. FIGS. 2A and 2B pertain to tensile stress layer formed over the MOS TX.

FIGS. 4A and 4B show top down figures of the dual stress layers according to a second example embodiment. FIG. 4A shows a PFET region with a compressive stress layer over the PFET MOS and a NFET region with a tensile stress layer over the NFET MOS TX.

DETAILED DESCRIPTION OF THE EXAMPLE EMBODIMENTS

B. Introduction

The example embodiments of the present invention will be described in detail with reference to the accompanying drawings. The example embodiments provide a method of forming a MOS transistor that has a stress layer and contact holes thru the stress layer. In example embodiments, the area and location of the contact holes is selected to obtain a desired stress from the stress layer on the MOS channel. The desired stress is used to enhance MOS device performance. The shape and location of the contact holes can be adapted to achieve the desired stress on the MOS channel. Also, additional holes or openings that are not used as contact hole can be formed in the stress layer to achieve the desire stress.

In general, tensile stress in semiconductor such as silicon, improves electron mobility so tensile stress (especially uniaxial stress) is used for to improve in NMOS device performance.

Similarly, compressive stress in semiconductors such as silicon improves hole mobility so compressive stress (especially uniaxial stress) is used in PMOS to improve device performance.

For an NFET, a tensile stress layer over a NFET provides a tensile stress on the NFET channel which improves NFET performance.

For an PFET, a compressive stress layer over a PFET provides a compressive stress on the PFET channel which improves PFET performance.

In an example embodiment, the NFET and PFET devices are formed using a stress layer. The NFET S/D contact areas and PFET S/D contact areas are designed so that the NFET and PFET contact areas are different so that the stress on the NFET and PFET devices achieves enhance performance.

For example, if a tensile stress layer is formed over both the NMOS and PMOS transistors, the PMOS S/D contact area is larger than the NMOS S/D contact area so the tensile stress on the PMOS channel is less than the tensile stress on the NMOS channel.

For example, if a compressive stress layer is formed both the NMOS and PMOS transistors, the NMOS contact area is larger than the PMOS contact area so that the compressive stress on the NMOS channel is less than the compressive stress on the PMOS channel.

MOS Transistor

Figure 1:
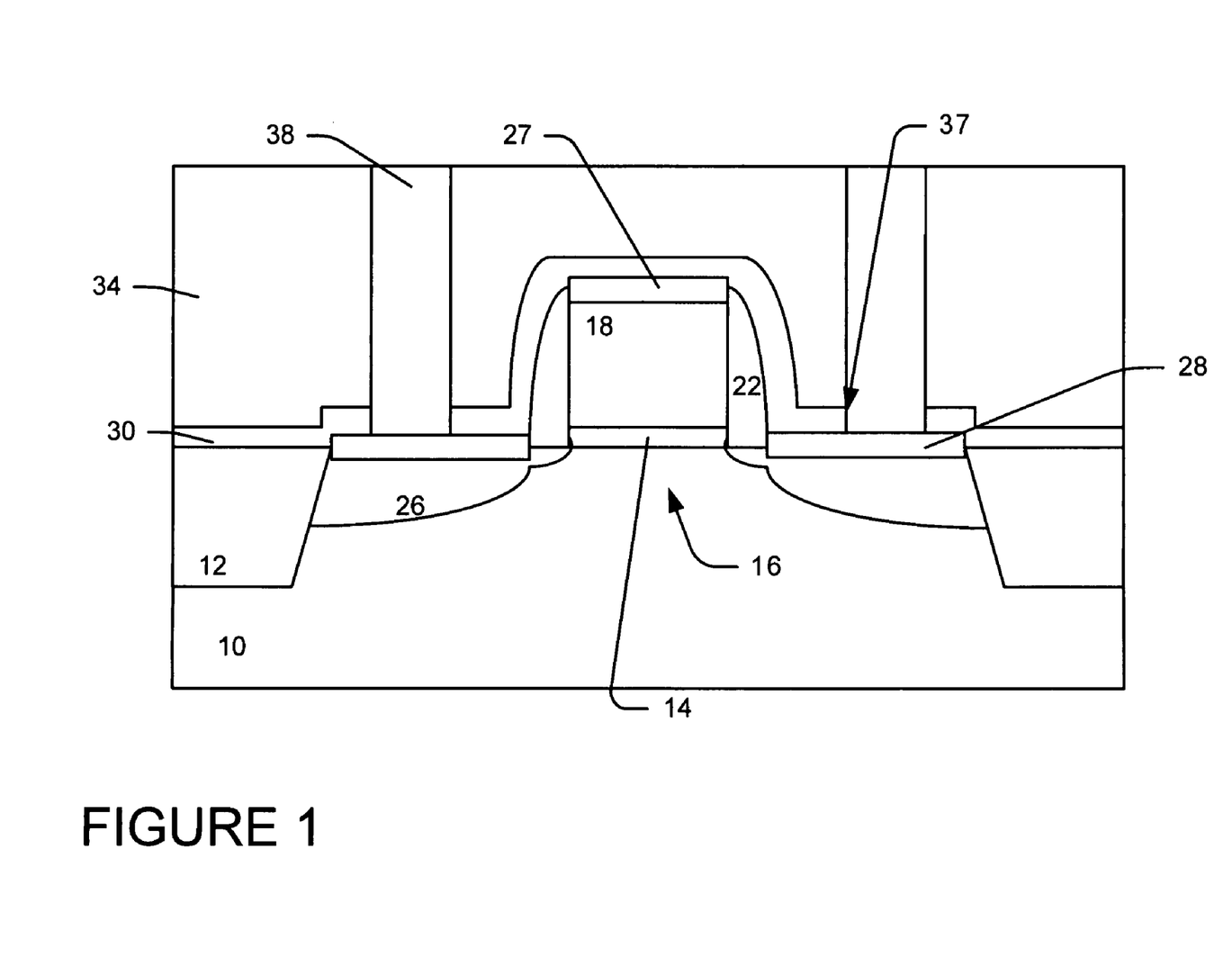
FIG. 1 shows a cross sectional view of an example MOS transistor over a substrate 10 according to an example embodiment of the present invention.

FIG. 1 shows a cross sectional view of an example MOS transistor over a substrate 10. The MOS transistor comprised of a gate 18, gate dielectric 14, channel region 16 under the gate 18; and source and drain (S/D) regions 26. Isolation regions 12, such as shallow trench isolation (STI) regions 12 are formed in the substrate and can be used to insulation between PMOS and NMOS regions. The isolations regions define the active areas where devices can be formed.

S/D silicide regions 28 and gate silicide region 27 can be formed.

The substrate can be any semiconductor substrate such as, without limitation, a crystalline substrate such as a Si wafer, a SiGe substrate, a SIO substrate.

A. Channel Direction and Gate Width and S/D Length and Width

The channel direction (channel length) is a direction along which carriers travel, and corresponds to a gate length direction. A direction perpendicular to the channel direction corresponds to the gate 18 width direction.

The S/D regions 26 have a length parallel to the gate length. The S/D regions 26 have a width parallel to the gate width.

B. Stress Layer 30

We form a stress layer 30 over the substrate surface. The stress layer can be an etch stop layer (ESL). The stress layer can comprised of a material that can provide tensile or compressive stress on the underlying layers or substrate. The stress layer preferably puts an uniaxial stress on the channel of a MOS device. The stress layer can be comprised of silicon nitride, silicon oxynitride, or germanium nitride. The stress layer's composition and thickness of can be We form dielectric layer 34 over the stress layer. The dielectric layer can be an interlevel dielectric layer comprised of an oxide.

C. Contact Holes Thru Stress Layer to Control the Stress on the Channel

We form S/D contact holes 37 in the stress layer 30 and the dielectric layer 34. The contact holes 37 gave a contact area.

The MOS contact hole area is designed and adapted to give the MOS channel the desired (predetermined) stress to achieve the desired (predetermined) MOS carrier mobility. The contact holes 37 are adapted to give the channel the desired (predetermined) stress to achieve the desired MOS carrier mobility.

The stress layer and contact holes can be adapted to put a desired stress/stain on a channel region by selecting/determining the following example parameters, 1) the volume of etch stop layer (ESL) layer—The deposition thickness of the ESL can be varied to increase the stress on the Si by the ESL. (ie the thicker the film the higher the stress) Typical film thickness is ~500 angstroms.

2) the area of ESL layer after subtracting for the contact holes The aim is also to maximize or minimize the ESL area for the nFET and pFET respectively for a tensile ESL. For the case of a compressive ESL, to minimize or maximize the ESL area for the nFET and PFET respectively.

3) positioning the contact holes a given distance N from the gate to maximize the effect of the contact holes.—To use the minimal design rule allowed for different technology for the case to reduce the stress cased by the tensile ESL on PFET or compressive ESL on nFET.

4) composition of the ESL—different compositions can create different stresses (compression and tensile) and different amounts of stress.

For an NFET, a tensile stress layer provides a tensile stress on the NFET channel which improves NFET performance.

For an PFET, a compressive stress layer provides a compressive stress on the PFET channel which improves PFET performance.

For the case of a tensile ESL, contacts on nFET should be smallest and further away form the gate region and contacts on PFET should be largest and closest to the gate region.

For the case of a compressive ESL, contacts on pFET should be smallest and further away form the gate region and contacts on nFET should be largest and closest to the gate region.

In the case when a dual stress liner (DSL) scheme is used, all contacts in nFET and pFET should be furthest away from the gate. In a dual stress liner scheme, a tensile stress layer is formed over the NMOS region and a compressive stress layer is formed over the PMOS region.

First Embodiment

Option A—Tensile Stress Layer Over Both PMOS and NMOS Transistors

Figures 2A, 2B:
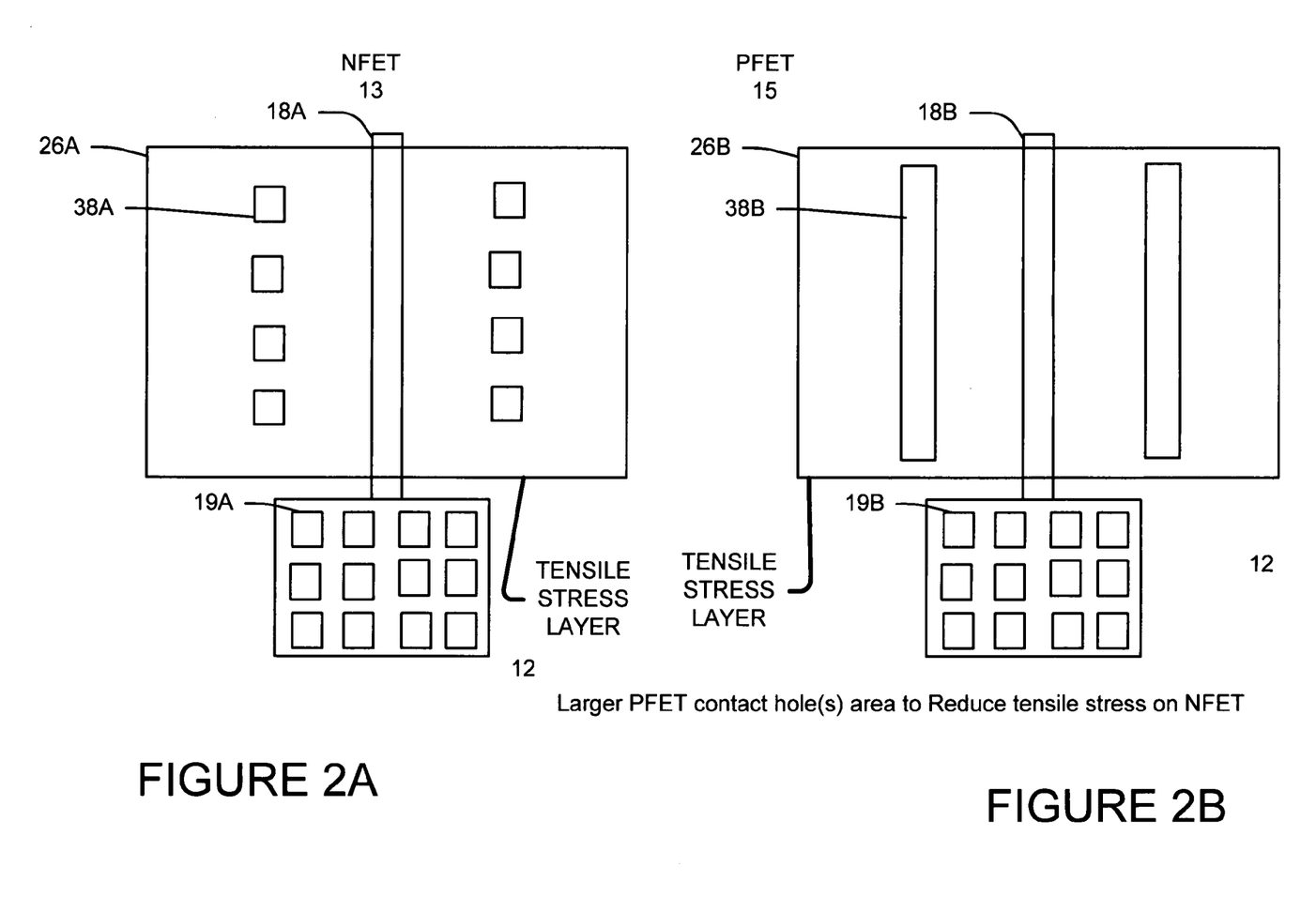

FIGS. 2A and 2B show an example embodiment for adapting the S/D contact hole area to obtain the desired stress on the channel regions. This can be used to obtain increased MOS device performance.

A. MOS Tx

Referring to FIGS. 2A and 2B, we provide a substrate 10 having a PMOS region 15 and a NMOS region 13. FIGS. 2A and 2B are top down views of devices corresponding to similar to the devices and elements shown in the cross sectional view in FIG. 1.

We provide a PMOS transistor in the PMOS region 15 and a NMOS transistor in the NMOS region 13.

The PMOS transistor can be comprised of a PMOS gate 18B, NMOS gate dielectric, PMOS channel; and PMOS S/D regions 26B. The transistor can have PMOS gate contacts 19A. The regions that are not active areas can be isolation regions.

The NMOS transistor can be comprised of a NMOS gate 18A, NMOS gate dielectric, NMOS channel, and NMOS S/D regions 26A. The transistor can have NMOS gate contacts 19B.

The transistor can have silicide layers.

B. Forming a Stress Layer

We form a stress layer 30 over the substrate 10 in at least the PMOS region 15 and the NMOS region 13. For the embodiment shown in FIGS. 2A and 2B, the stress layer produces a tensile stress on the PMOS and NMOS channel regions.

C. Forming a Dielectric Layer Over the Stress Layer

We then form a dielectric layer 34 over the stress layer 34. The dielectric layer can be an interlevel dielectric layer comprised of oxide.

D. Contact Holes

In a key step, we form PMOS contact holes thru the stress layer in the PMOS region 15 to expose portions of the PMOS S/D regions 26B; and we form NMOS contact holes thru the stress layer 30 in the NMOS region 13 to expose portions of the NMOS S/D regions 26A.

The PMOS contact holes have a PMOS contact area. The NMOS contact holes have a NMOS contact area.

The PMOS contact holes and contact area are adapted to give the PMOS channel the desired (predetermined) stress to achieve the desired PMOS carrier mobility.

The NMOS contact area and contact holes are adapted to give the NMOS channel the desired (predetermined) stress to achieve the desired NMOS carrier mobility;

In a preferred option, the PMOS S/D contact area is larger than the NMOS S/D contact area so the tensile stress on the PMOS channel is less than the tensile stress on the NMOS channel.

The MOS S/D contact area % is area of the S/D contact hole divided by the total S/D area.

For example, the NMOS contact hole area % can be between about ~5% to 30% of the total NMOS S/D area. This compares to the PMOS contact hole area as a percent of the total PMOS S/D area of between 60% to 90%.

For example, the ratio of the NMOS S/D contact area % to the PMOS S/D contact area % is between 1:18 to 1:2.

For example, the PFET channel stress can be between 0 to 200 MPa and the NFET channel stress can between 500 MPa to 1500 MPa (depending on the stress film of the ESL).

The transistor layout for nFET and pFET can be manipulated to relax the tensile stress of the ESL layer selectively on the pFET by using a long contact via 38B which will remove a large volume of stress layer (e.g., nitride cap) which results in the reduction of both the [001] and [110] stress on the PFET channel.

FIG. 2A shows a layout for the nFET with small and spaced contact holes 38A. FIG. 2B shows a layout for a PFET with long contact via 38B (or alternatively with closely spaced via) when a tensile ESL is used. Note that the via drawn are for illustration purpose, i.e., the via can be in any shape to achieve the best effect of relaxing the stress or maintaining the stress.

Using the different in layout for the contact via sizes, we can reduce the tensile stress on the pFET using larger and continuous contact holes (vias) while maintaining the tensile stress on the nFET.

In another aspect, the NFET S/D contact holes are further way (e.g., on average) from the NFET gate than the PFET S/D contact holes are from the PFET gate.

E. Contact Plugs

We then form contact plugs 38 in the PMOS contact holes and the NMOS contact holes. The contact plugs 38 can be a conductive metal such as W.

First Embodiment

Second Option—Compressive (ESL) Stress Layer—

Figures 3A, 3B:
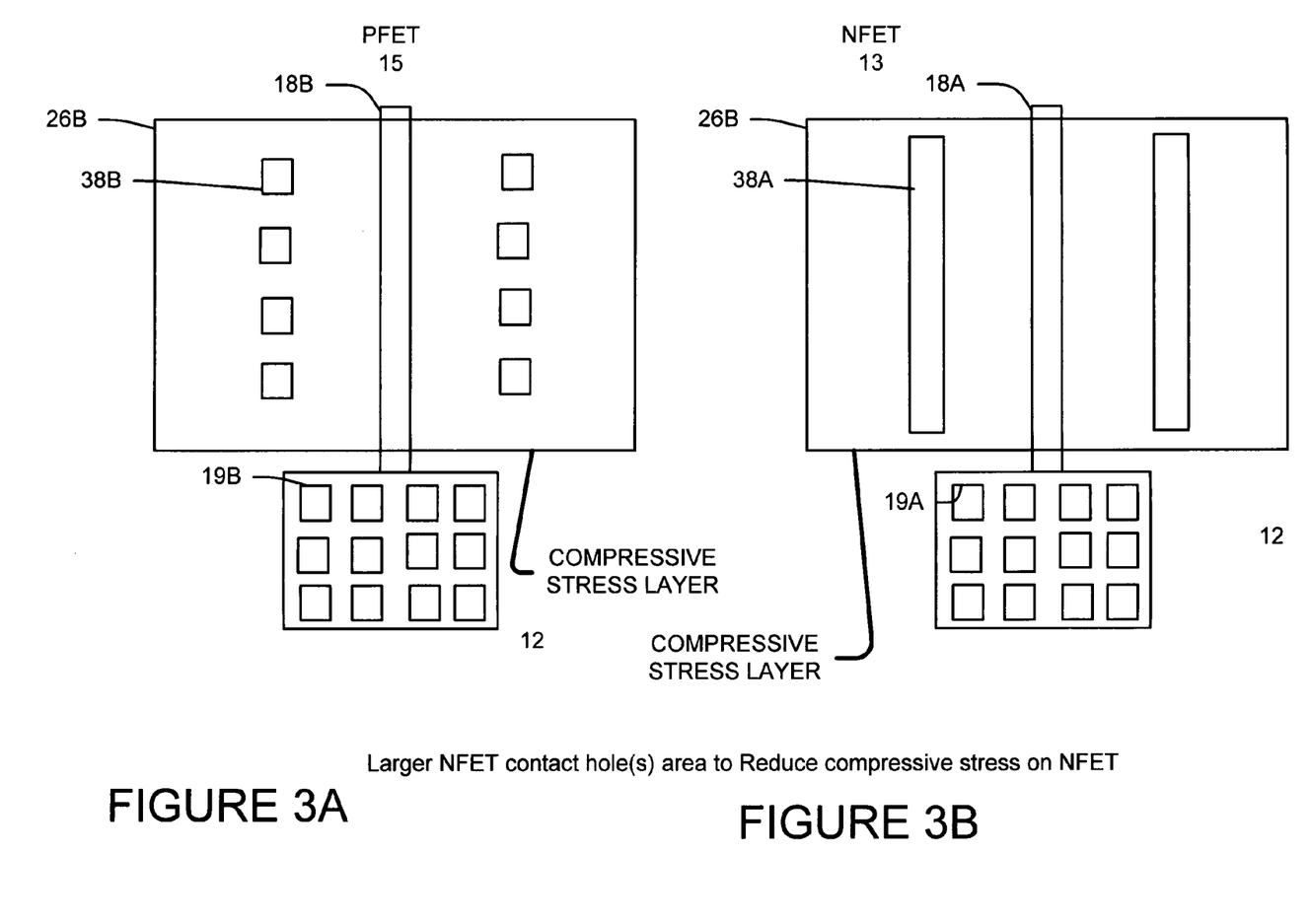
FIGS. 3A and 3B show top down views of another example embodiment where the stress layer 30 is a compressive stress layer that induces a compressive stress on the channel regions.

FIGS. 3A and 3B shows another example embodiment where the stress layer 30 is a compressive stress layer that induces a compressive stress on the channel regions.

The method and structure to form the MOS transistors and other devices is the same as described above. In this embodiment, the stress layer 30 has a compressive stress.

In an preferred option, the NMOS contact area is larger than the PMOS contact area so the compressive stress from the stress layer on the NMOS channel is less than the compressive stress on the PMOS channel.

FIG. 3B, shows an improvement of pFET using a highly compressive ESL coupled with a long contact via hole 38A (or closely packed multiple via) for the nFET the reduce the compressive stress on the NFET channel.

The transistor layout for nFET and pFET can be manipulated to relax the compressive stress of the ESL layer selectively on the nFET by using a long contact via to remove a large volume of nitride cap which results in the reduction of both the [001] and [110] stress.

Second Example Embodiment

Tensile NMOS Stress Layer and Compressive PMOS Stress Layer

In a second example embodiment, the stress layer is comprised of a NMOS stress layer that is formed over the NMOS region and a PMOS stress layer formed over the PMOS region. The NMOS stress layer is a tensile stress layer that puts a tensile stress on the NMOS channel. The PMOS stress layer is a compressive stress layer that puts a compressive stress on said PMOS channel.

The stress layers and contact holes for the NMOS and PMOS are adapted and designed to obtain a predetermined stress for the NMOS and PMOS Tx.

Figures 4A, 4B:
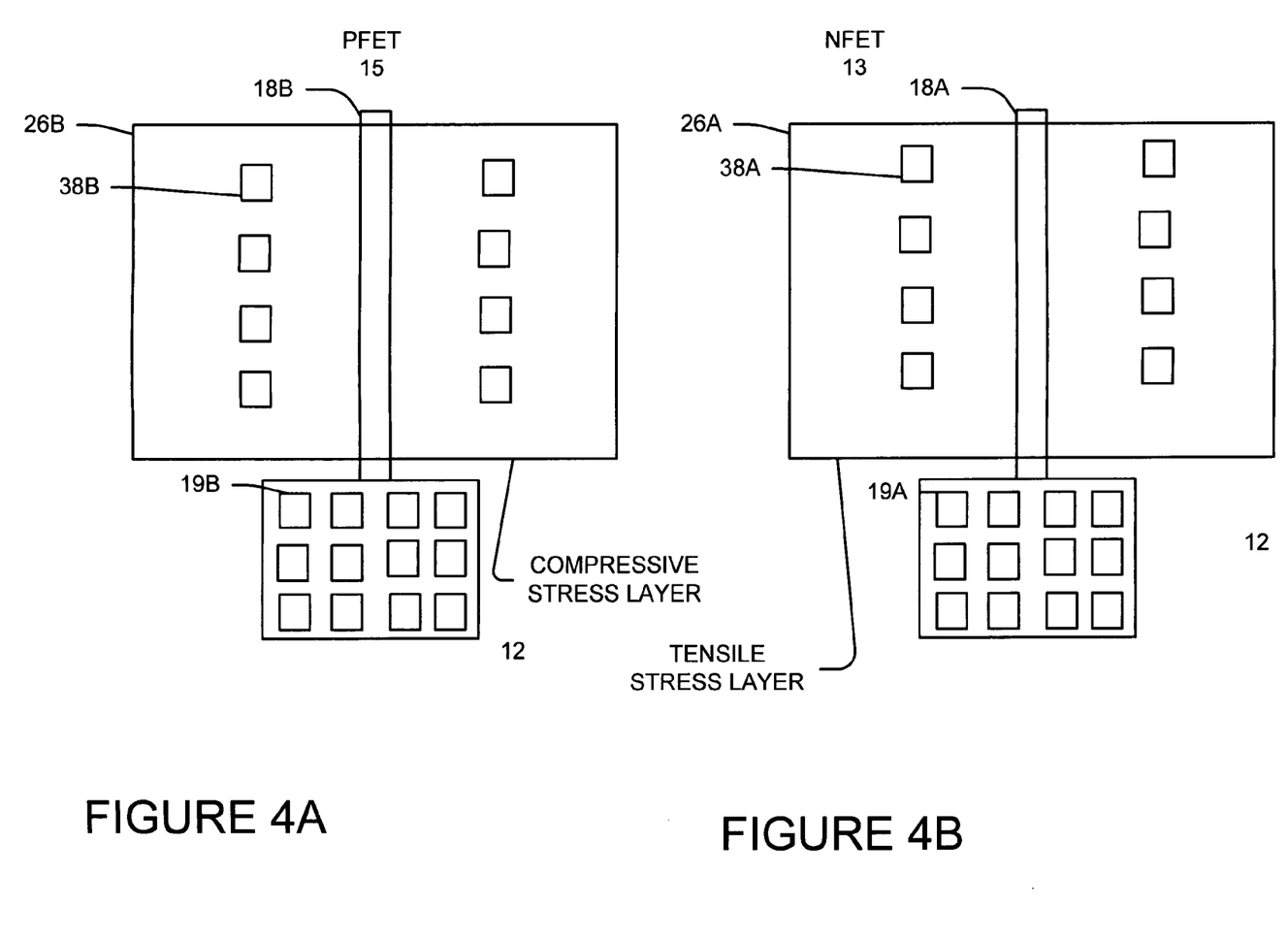

FIGS. 4A and 4B show top down figures of the dual stress layers. FIG. 4A shows a PFET region 15 with a compressive stress layer over the PFET MOS and a NFET region 13 with a tensile stress layer over the NFET MOS TX. The contact holes are adapted to reduce or minimize the stress reducing effects of the contact hole on the stress layers.

For example, the stress layers and contact holes for the NMOS and PMOS are adapted and designed to obtain the maximum stress by forming the smallest possible contact holes (as determined by design rule and other device design limitations) and/or placing the small contact hole as far from the gates to minimize the relaxation (stress reducing) effect of the contact holes on the stress layer.

Options Contact Holes Adapted by Using Different Contact Hole Areas, Shapes, Sizes and Locations.

The example embodiments contact area can be adapted by using different contact hole shapes and sizes.

FIGS. 2A and 2B; & 3A and 3B show examples where the contact holes with the smaller area are discrete rectangular or square shaped contact holes. The contact holes with the larger area are one discrete rectangular shaped contact holes with the length of the contact hole parallel to the gate length.

Figure 5A:
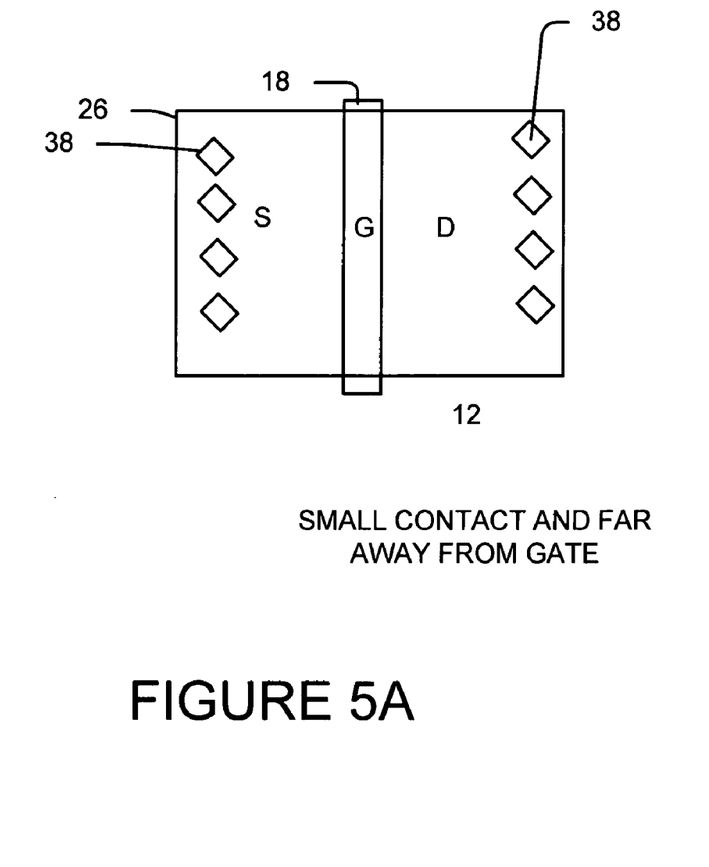
FIG. 5A shows a top down view of small contacts holes spaced further away from the gate to minimize the effect of the contact holes on the stress layer and stress induce to the channel according to an example embodiment of the present invention.

FIG. 5A shows a top down view of small contacts holes 38 spaced further away from the gate 18 to minimize the effect of the contact holes on the stress layer and stress induce to the channel.

Figure 5B:
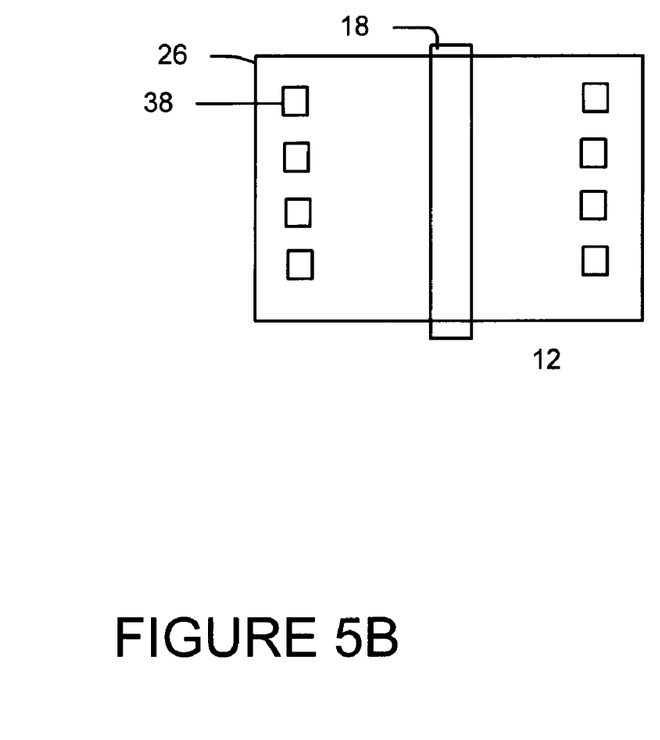
FIG. 5B shows a top down view of small contacts holes spaced further away from the gate to minimize the effect of the contact holes on the stress layer and stress induce to the channel according to an example embodiment of the present invention.

FIG. 5B shows a top down view of small contacts holes 38 spaced further away from the gate 18 to minimize the effect of the contact holes on the stress layer and stress induce to the channel.

Figure 6A:
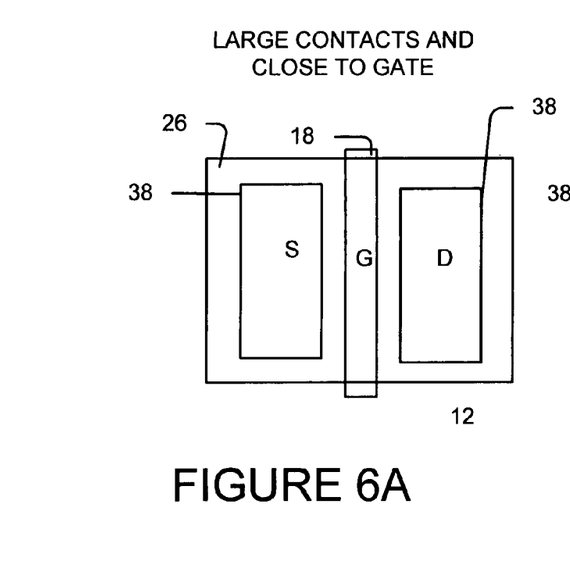
FIGS. 6A, 6B and 6C show example top down views of relatively large contact holes that are preferably spacer closer to the gate to reduce the stress from the stress layer on the channel according to an example embodiment of the present invention.
Figure 6B:
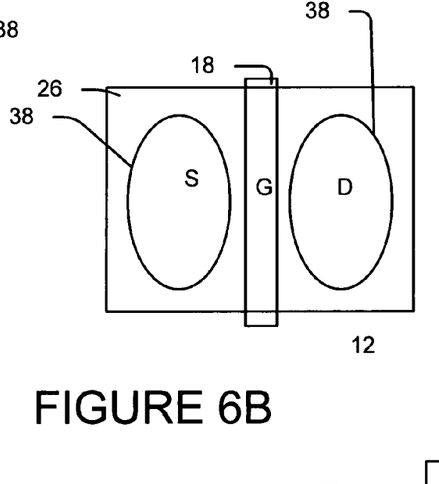
Figure 6C:
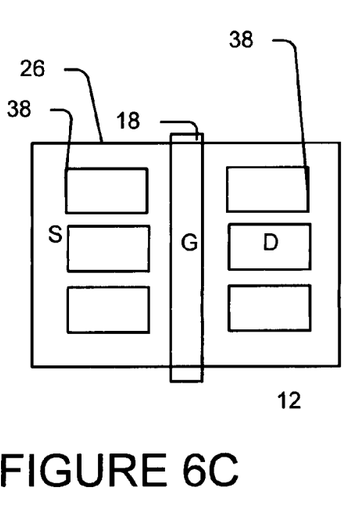

FIGS. 6A, 6B and 6C show example top down views of relatively large contact holes 18 that are preferably spacer closer to the gate to reduce the stress from the stress layer on the channel.

A. Short and Large Width Devices

Figure 7A:
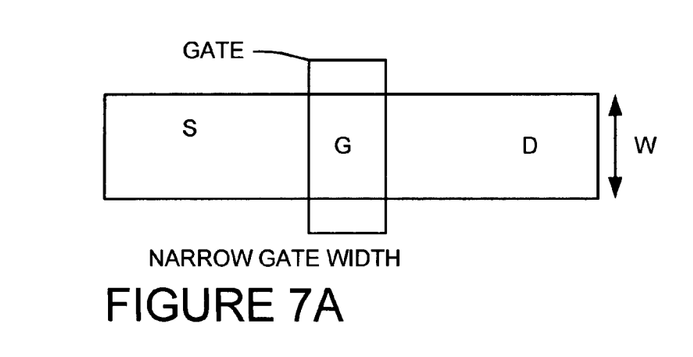
FIG. 7A shows a top down view of a relatively narrow width Gate and narrow width S/D region according to an example embodiment of the present invention.

FIG. 7A shows a top down view of a relatively narrow width Gate and narrow width S/D region.

Figure 7B:
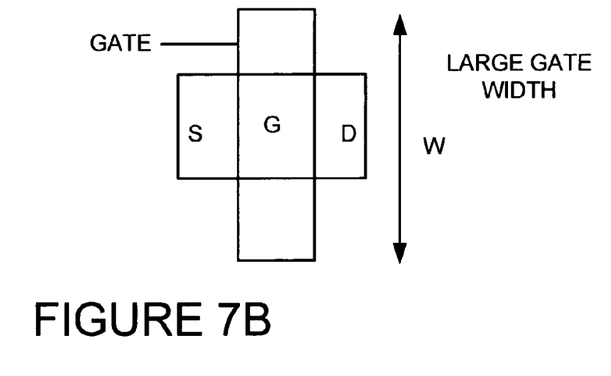
FIG. 7B shows a top down view of a relatively large width Gate and relatively large width S/D region according to an example embodiment of the present invention.

FIG. 7B shows a top down view of a relatively large width Gate and relatively large width S/D region.

These embodiments are applicable for both short and long width devices. The transistor layout for nFET/pFET can be manipulated to relax the compressive/tensile stress of the ESL layer selectively on the nFET/pFET respectively. This is achieved by using different contact via shapes and sizes for nFET and pFET during layout.

When a tensile ESL is used, small contact via are used for nFETs to reduce the loss of the nitride film stress. On the other hand, large and long via will be used for pFET to remove a large volume of the nitride. Note that the shape and size of the via used can be varied to achieve the best effect of stress relaxation. The shape of the via for narrow width devices and long width devices need not be the same as well since narrow width devices, as compared to long width devices, would be affected more by two dimensional stress and hence different shape of via may need to be release the stress.

Similarly, when a compressive ESL is used, small contact via are used for pFETs to reduce the loss of the nitride film stress. On the other hand, large and long via will be used for nFET to remove a large volume of the nitride. Note that the shape and size of the via can be varied to achieve the best effect of stress relaxation. The shape of the via for narrow width devices and long width devices need not be the same as well since narrow width devices, as compared to long width devices, would be affected more by two dimensional stress and hence different shape of via may need to be release the stress.

The further away from the gate and smaller the contacts holes, the lesser the stress will be relaxed. The closer and larger the contacts, the more the stress will be relaxed.

B. Stress in Channel from the Stress Layer

Figure 8:
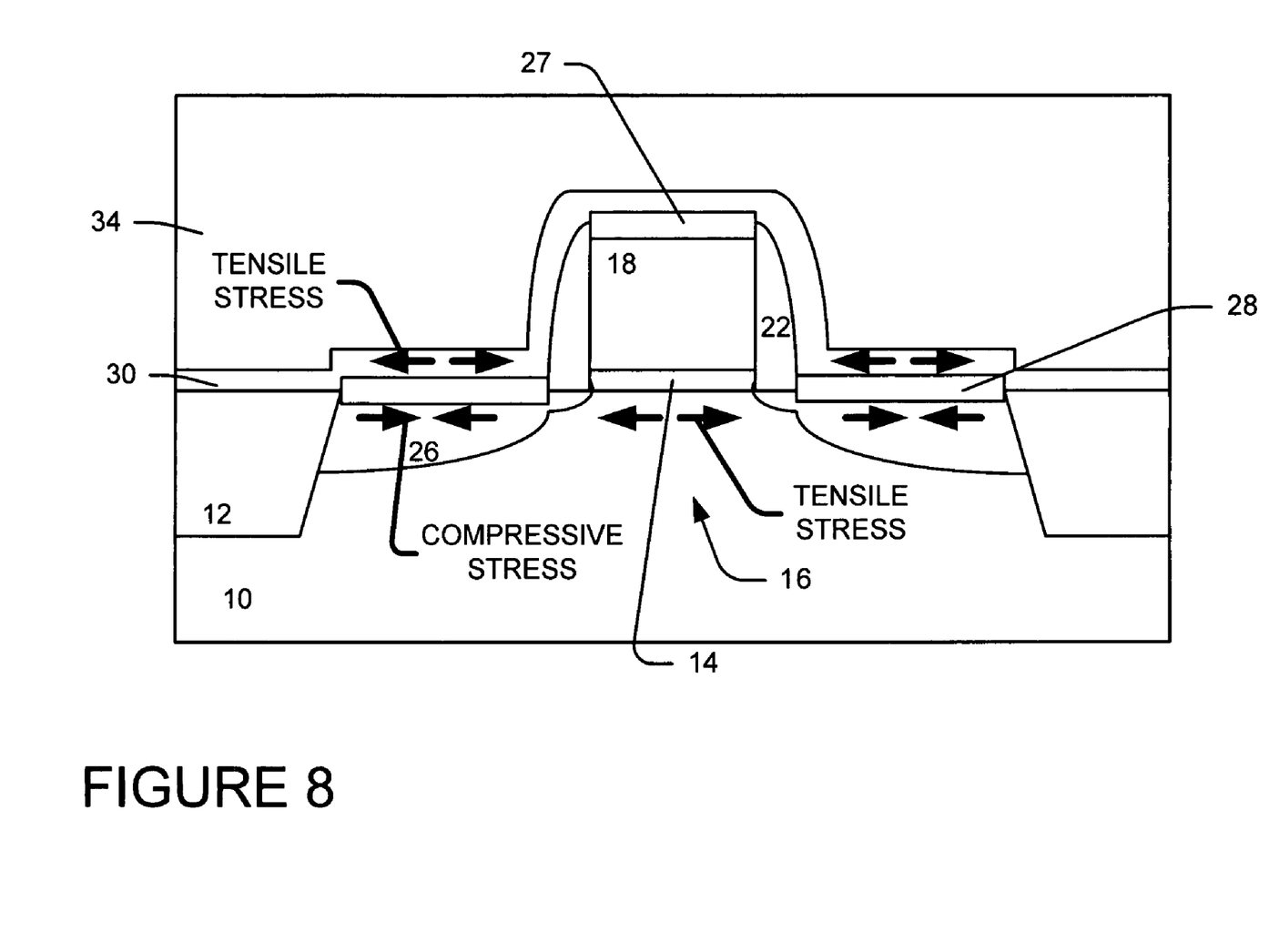
FIG. 8 is a cross sectional view of a transistor having an tensile stress layer 30 there over that causes a tensile stress in the channel region 16 according to an embodiment of the invention.

FIG. 8 shows an example of an tensile stress layer 30 over a MOS transistor. It is thought that the tensile stress layer 30 induces a compressive stress in the substrate (e.g., both S/D regions 26) below which in turn induces a tensile stress in the channel region 16 of the transistor in the direction of the channel length (direction between the source and drain). The arrows in the figure indicate the direction/type of the stress. There may be additional stresses caused. For example, if the width of the device is narrow, there is a possibility that the direction perpendicular to the channel will also be tensile.

C. Non-limiting Example Embodiments

The embodiments of the invention can be used in any type of semiconductor devices (e.g. BI-FET devices). The embodiments can be applied to all types of devices to form strain layer in a certain direction.

Although this invention has been described relative to specific insulating materials, conductive materials and apparatuses for depositing and etching these materials, it is not limited to the specific materials or apparatuses but only to their specific characteristics, such as conformal and nonconformal, and capabilities, such as depositing and etching, and other materials and apparatus can be substituted as is well understood by those skilled in the microelectronics arts after appreciating the present invention Given the variety of embodiments of the present invention just described, the above description and illustrations show not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabrication of a semiconductor device comprising:
   providing a substrate having a PMOS region and a NMOS region;
   providing a PMOS transistor in the PMOS region and a NMOS transistor in the NMOS region, wherein
      the PMOS transistor comprises a PMOS gate, PMOS gate dielectric, PMOS channel and PMOS S/D regions, and
      the NMOS transistor comprises a NMOS gate, NMOS gate dielectric, NMOS channel, and NMOS S/D regions;
   forming a stress layer having a first stress over the substrate, the stress layer covering the PMOS region and the NMOS region;
   forming a dielectric layer over the stress layer;
   forming PMOS S/D contact holes having a PMOS S/D contact layout design through the stress layer in the PMOS region to expose portions of the PMOS S/D regions and NMOS S/D contact holes having a NMOS S/D contact layout design through the stress layer in the NMOS region to expose portions of the NMOS S/D regions, wherein
      the PMOS S/D contact hole layout design is based on PMOS stress considerations and has a PMOS S/D contact hole area, the PMOS S/D contact layout design comprises adapting size, shape, number or location or a combination thereof of the PMOS S/D contact holes to cause the stress layer with the first stress to induce a first desired stress on the PMOS channel based on the PMOS stress considerations,
      the NMOS S/D contact hole layout design is based on NMOS stress considerations and has a NMOS S/D contact hole area, and the NMOS S/D contact layout design comprises adapting size, shape, number or location or a combination thereof of the NMOS S/D contact holes to cause the stress layer with the first stress to induce a second desired stress on the NMOS channel based on the NMOS stress considerations,
      wherein the PMOS S/D contact hole area is larger than the NMOS S/D contact hole area or the PMOS S/D contact holes are closer to the PMOS gate than the NMOS S/D contact holes are to the NMOS gate or a combination thereof, and
      the first desired stress is different from the second desired stress; and
   forming contact plugs in the PMOS contact holes and the NMOS contact holes.

2. The method of claim 1 wherein:
the stress layer is a tensile stress layer and the first desired stress comprises a tensile stress; and
the PMOS S/D contact hole area is larger than the NMOS S/D contact hole area, wherein the first desired stress is less tensile than the second desired stress.

3. The method of claim 1 wherein:
the stress layer is a tensile stress layer and the first desired stress comprises a tensile stress; and
the PMOS S/D contact holes are closer to the PMOS gate than the NMOS S/D contact holes are to the NMOS gate, wherein the first desired stress is less tensile than the second desired stress.

4. The method of claim 1 wherein:
the stress layer is a tensile stress layer and the first desired stress comprises a tensile stress;
the PMOS S/D contact hole area is larger than the NMOS S/D contact hole area;
the PMOS S/D contact holes are closer to the PMOS gate than the NMOS S/D contact holes are to the NMOS gate; and
wherein the first desired stress is less tensile than the second desired stress.

5. The method of claim 1 wherein:
the stress layer is a compressive stress layer and puts the first desired stress comprising a compressive stress on the PMOS channel; and
the NMOS S/D contact area is larger than the PMOS S/D contact area wherein the second desired stress is less compressive than the first desired stress.

6. The method of claim 1 wherein:

the stress layer is a compressive stress layer and puts the first desired stress comprising a compressive stress on the PMOS channel; and the NMOS S/D contact holes are closer, on average, to the NMOS gate than the PMOS S/D contact holes are to the PMOS gate, wherein the second desired stress is less compressive than the first desired stress.

7. The method of claim 1 wherein:

the stress layer is a compressive stress layer and puts the first desired stress comprising a compressive stress on the PMOS channel;

the NMOS S/D contact holes are closer, on average, to the NMOS gate than the PMOS S/D contact hole are to the PMOS gate;

the NMOS S/D contact area is larger than the PMOS contact hole S/D area; and wherein the second desired stress is less compressive than the first desired stress.

8. A semiconductor device comprising:

a substrate having a PMOS region and a NMOS region;

a PMOS transistor in the PMOS region and a NMOS transistor in the NMOS region, wherein the PMOS transistor is comprised of a PMOS gate, PMOS gate dielectric, PMOS channel and PMOS S/D regions, and the NMOS transistor is comprised of a NMOS gate, NMOS gate dielectric, NMOS channel, and NMOS S/D regions;

a stress layer having a first stress disposed over the substrate over the PMOS region and the NMOS region;

a dielectric layer disposed over the stress layer;

PMOS S/D contact holes having a PMOS S/D contact layout design through the stress layer in said PMOS region to expose portions of the PMOS S/D regions and NMOS S/D contact holes having a NMOS S/D contact layout design through the stress layer in the NMOS region to expose portions of the NMOS S/D regions, wherein, the PMOS S/D contact hole design is based on PMOS stress considerations and has a PMOS S/D contact hole area, the PMOS S/D contact layout design comprises adapting size, shape, number or location or a combination thereof of the PMOS S/D contact holes to cause the stress layer with the first stress to induce a first desired stress on the PMOS channel based on the PMOS stress considerations, the NMOS S/D contact hole design is based on NMOS stress considerations and has a NMOS S/D contact hole area, the NMOS S/D contact layout design comprises adapting size, shape, number or location or a combination thereof of the NMOS S/D contact holes to cause the stress layer with the first stress to induce a second desired stress on the NMOS channel based on the NMOS stress considerations, wherein the PMOS S/D contact hole area is larger than the NMOS S/D contact hole area or the PMOS S/D contact holes are closer to the PMOS gate than the NMOS S/D contact holes are to the NMOS gate or a combination thereof, and the first desired stress is different from the second desired stress; and contact plugs in the PMOS contact holes and the NMOS contact holes.

9. The device of claim 8 wherein:

the stress layer is a tensile stress layer that induces the first desired stress comprising a tensile stress; and the PMOS S/D contact hole area is larger than the NMOS S/D contact hole area, wherein the first desired stress is less tensile than the second desired stress.

10. The device of claim 8 wherein:

the stress layer is a tensile stress layer that induces the first desired stress comprising a tensile stress; and the PMOS S/D contact holes are closer to the PMOS gate than the NMOS S/D contact holes are to the NMOS gate, wherein the first desired stress is less tensile than the second desired stress.

11. The device of claim 8 wherein:

the stress layer is a tensile stress layer that induces the first desired stress comprising a tensile stress; and the PMOS S/D contact hole area is larger than the NMOS S/D contact hole area and the PMOS S/D contact holes are closer to the PMOS gate than the NMOS S/D contact holes are to the NMOS gate, wherein the first desired stress is less tensile than the second desired stress.

12. The device of claim 8 wherein:

the stress layer is a compressive stress layer and puts the first desired stress comprising a compressive stress on the PMOS channel; and the NMOS S/D contact area is larger than the PMOS S/D contact area, wherein the second desired stress is less compressive than the first desired stress.

13. The device of claim 8 wherein:

the stress layer is a compressive stress layer and puts the first desired stress comprising a compressive stress on the PMOS channel; and the NMOS S/D contact holes are closer, on average, to the NMOS gate than the PMOS S/D contact holes are to the PMOS gate, wherein the second desired stress is less compressive than the first desired stress.

14. The device of claim 8 wherein:

the stress layer is a compressive stress layer, wherein the stress layer puts a compressive stress on the PMOS channel;

the NMOS S/D contact holes are closer, on average, to the NMOS gate than the PMOS S/D contact hole are to the PMOS gate and the NMOS S/D contact area is larger than the PMOS contact hole S/D area, wherein the second desired stress is less compressive than the first desired stress.

15. A method of forming a device comprising:

providing a substrate prepared with first and second active regions, wherein the first active region comprises a first transistor and the second active region comprises a second transistor;

forming a stress layer having a first stress over the first and second active regions covering the first and second transistors;

forming a dielectric layer over the stress layer;

forming first and second contact openings in the first and second active regions in communication with diffusion regions of the first and second transistors, wherein the first contact openings have a first contact layout design based on first stress considerations, the first contact layout design causes the stress layer with the first stress in the first active region to induce a first desired stress on a channel region of the first transistor based on the first stress considerations, the first contact openings of the first transistor comprise a first contact area, and the second contact openings have a second contact layout design based on second stress considerations, the second contact layout design causes the stress layer with the first stress in the second active region to induce a second desired stress on a channel region of the second transistor based on the second stress considerations, the second contact openings of the second transistor comprise a second contact area, and wherein the first contact area is smaller than the second contact area to reduce or minimize relaxing effects of the contact openings.

16. The method of claim 15 wherein:
the first stress comprises a tensile stress;
the first transistor comprises a n-type transistor;
the second transistor comprises a p-type transistor; and
the first desired stress is more tensile than the second desired stress.

17. The method of claim 15 wherein:
the first contact layout design comprises adapting size, shape, number or location or a combination thereof of the first contact openings; and
the second contact layout design comprises adapting size, shape, number or location or a combination thereof of the second contact openings.

18. The method of claim 17 wherein the first contact openings, on average, are located farther away from a gate of the first transistor between the diffusion regions to reduce or minimize relaxing effects of the contact openings.

19. The method of claim 15 wherein a ratio of the first contact opening area to the second contact opening area is about 1:18-1:2.

20. The method of claim 15 wherein the first contact openings, on average, are located farther away from a gate of the first transistor between the diffusion regions to reduce or minimize relaxing effects of the contact openings.

21. A device comprising:
a substrate having first and second active regions, wherein the first active region comprises a first transistor which is a n-type transistor and the second active region comprises a second transistor which is a p-type transistor;
a stress layer having a first stress over the first and second active regions covering the first and second transistors;
a dielectric layer disposed over the stress layer; and
first contact openings in the first active region in communication with diffusion regions of the first transistor and second contact openings in the second active region in communication with diffusion regions of the second transistor through the stress layer, wherein
the first contact openings have a first contact layout design based on first stress considerations, the first contact layout design causes the stress layer with the first stress in the first active region to induce a first desired stress on a channel region of the first transistor based on the first stress considerations, the first contact openings of the first transistor comprise a first contact area, and
the second contact openings have a second contact layout design based on second stress considerations, the second layout design causes the stress layer with the first stress in the second active region to induce a second desired stress on a channel region of the second transistor based on the second stress considerations, the second contact openings of the second transistor comprise a second contact area, and
wherein the first contact area is smaller than the second contact area or the first contact openings, on average, are located farther away from a gate of the first transistor or a combination thereof to reduce or minimize relaxing effects of the contact openings.

22. A method of forming a device comprising:
providing a substrate prepared with
a first active region with a first transistor which is a p-type transistor,
a second active region with a second transistor which is a n-type transistor,
a first stress layer on the active regions over the transistors, the stress layer having a first stress, and
a dielectric layer over the stress layer;
forming first contacts to first contact regions of the first transistor, wherein the first contacts comprise a first contact layout to cause a first desired stress on a first target region;
forming second contacts to second contact regions of the second transistor, wherein the second contacts comprise a second contact layout to cause a second desired stress on a second target region; and
wherein
the first contact layout has a larger area than the second contact layout,
the first contacts of the first contact layout are closer to the first transistor than the second contacts of the second contact layout to the second transistor, or
a combination thereof.

23. The method of claim 22 wherein
the first desired stress is different from the second desired stress.

24. The method of claim 22 wherein:
the first contact regions comprise first S/D regions of the first transistor;
the first target region comprises a first channel below a gate of the first transistor;
the second contact regions comprise second S/D regions of the second transistor; and
the second target region comprises a second channel below a gate of the second transistor.

25. The method of claim 22 wherein:
the first contact layout comprises adapting size, shape, number or location or a combination thereof of the first contact opening; and
the second contact layout comprises adapting size, shape, number or location or a combination thereof of the second contact opening.

26. The method of claim 25 wherein:
the first contact regions comprise first S/D regions of the first transistor; and
the first target region comprises a first channel below a gate of the first transistor;
the second contact regions comprise second S/D regions of the second transistor; and
the second target region comprises a second channel below a gate of the second transistor.

27. The method of claim 22 wherein:
the first stress comprises tensile stress;
the first desired stress is less tensile than the second desired stress.

28. The method of claim 23 wherein:
the first contact layout is selected to increase or maximize relaxing effects on the stress layer; and
the second contact layout is selected to reduce or minimize relaxing effects on the stress layer.

29. The method of claim 22 wherein the first contact layout is selected to increase or maximize relaxing effects on the stress layer.

* * * * *